Figure 1:
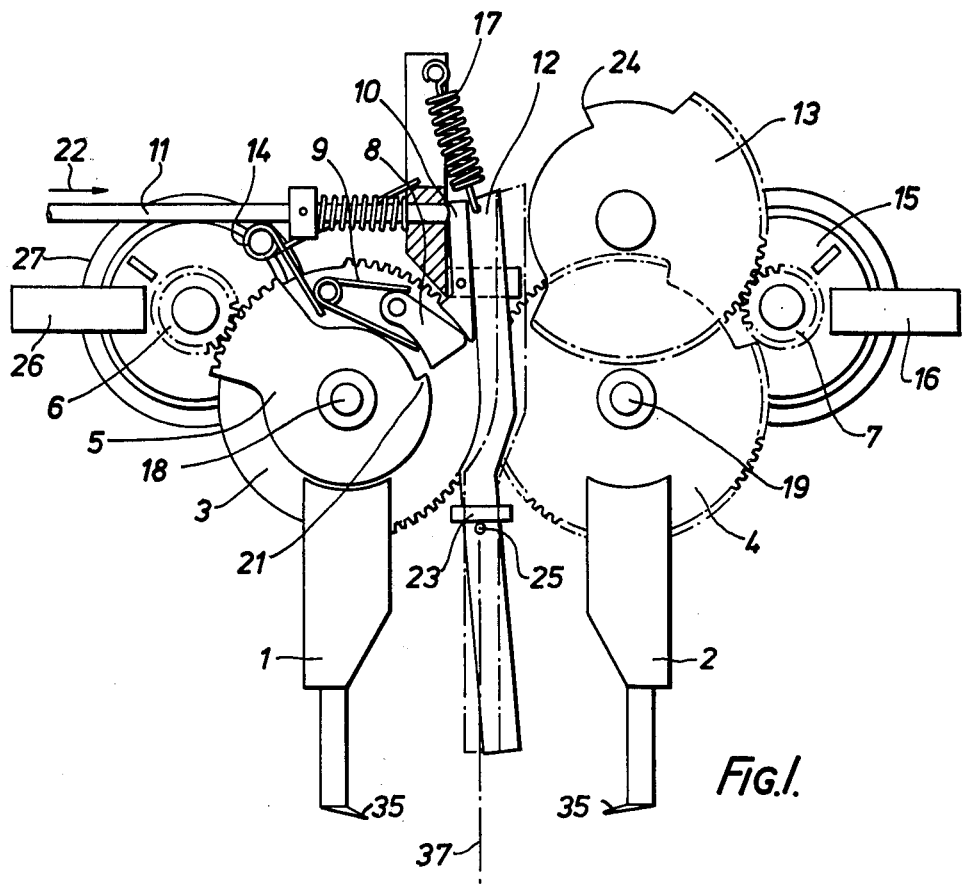

United States Patent [19]

Blount

[11] 4,286,380

[45] Sep. 1, 1981

[54] MANIPULATOR MECHANISMS

[75] Inventor: Eric A. Blount, Chelmsford, England

[73] Assignee: The Marconi Company Limited, Chelmsford, England

[21] Appl. No.: 140,490

[22] Filed: Apr. 15, 1980

[30] Foreign Application Priority Data

May 22, 1979 [GB] United Kingdom ............... 17793/79

[51] Int. Cl.³ ........................ B66C 1/42; H05K 13/04
[52] U.S. Cl. ....................................... 29/741; 29/758; 294/87 R; 294/106
[58] Field of Search .............. 294/63 R, 67 BC, 86 R, 294/87 R, 87.22, 88, 106; 29/741, 758, 762, 764; 414/589, 623, 626, 736, 739, 753

[56] References Cited

U.S. PATENT DOCUMENTS

| 3,147,993 | 9/1964  | Broderson et al. ............ 294/106 X |
| 3,270,897 | 9/1977  | Lingl .............................. 294/87 R X |
| 3,534,872 | 10/1970 | Roth et al. ..................... 294/87 R X |
| 3,780,415 | 12/1973 | Ragard ............................. 29/741 X |
| 4,030,180 | 6/1977  | Pierson .................................. 29/741 |
| 4,161,064 | 7/1979  | Woodman et al. .................... 29/741 |

Primary Examiner—Johnny D. Cherry
Attorney, Agent, or Firm—Spencer & Kaye

[57] ABSTRACT

A manipulator mechanism for handling small electronic components consists of a number of pairs of fingers, each pair being movable independently and being capable of being used for electrically testing the component. The mechanism can position the component accurately above its required location on a printed circuit board and movable push rods are used to insert the electrical leads of the component into their required positions.

8 Claims, 3 Drawing Figures

MANIPULATOR MECHANISMS

This invention relates to manipulator mechanisms. Many assembly processes are becoming increasingly automated not only to allow assembly tasks to be carried out more quickly and reliably, but also to make practicable tasks which were previously too time consuming, difficult or expensive to be performed manually. Although the invention is of general application, it is particularly applicable to the handling of electronic components which are often very small, fragile or complicated, but which nevertheless must be located very precisely in a possibly large and complex electronic circuit. The present invention seeks to provide a manipulator mechanism which is suitable for this purpose.

According to this invention a manipulator mechanism includes a plurality of pairs of fingers, both fingers of a given pair being capable of movement towards each other in a single plane relative to each other about a datum line lying in said plane, said single planes for all pairs of fingers being parallel to each other and the datum line of all pairs lying in the same plane which is perpendicular to said single planes, each pair of fingers being movable independently of at least some other pairs of fingers; and wherein said movement is produced by means of a pair of engaging wheels one of which drives the other so that rotation of one wheel in one direction produces an opposite rotation of the other wheel, with at least one finger being moved by the action of each wheel; and means for moving fingers of selected pairs towards each other under action of a common drive means.

Preferably the movement of both fingers of a pair is symmetrical about the datum line.

Preferably movement in the symmetrical manner is produced by means of a pair of engaging wheels, one of which drives the other so that rotation of one wheel in one direction produces an equal and opposite rotation of the other wheel, with each finger of a pair being moved by the action of a respective wheel.

Preferably again the pair of wheels are meshing gear wheels of equal diameter.

Preferably a separate pair of meshing gear wheels are provided for each pair of fingers, with the axes of rotation of the gear wheels lying perpendicular to the plane of movement of the fingers.

Preferably again means are provided for moving fingers of selected pairs towards each other and for moving fingers of remaining non-selected pairs away from each other.

In normal operation the selected fingers are intended to engage a body which is to be manipulated. The body may be an electronic component having electrically conductive leads which are to be precisely inserted into a circuit. Typically, a circuit consists of a board having a pattern of conductive tracks formed on at least one surface of it, with small holes in the board into which the conductive leads of the electronic components are to be inserted. After insertion through the small holes the leads are secured to the conductive tracks by means of solder, for example. Although some electronic components, such as resistors, are relatively simple and possess only two electrical leads, other circuit components are much more complex. For example, the so called dual-in-line package contains many more leads—a typical figure is sixteen leads, arranged in two parallel rows. Such components can be very difficult to handle, since all sixteen leads must be precisely aligned with sixteen co-operating holes of the circuit board, and inserted into them simultaneously.

If a defective electronic component is attached to a circuit board, it can be even more difficult to subsequently remove it for replacement by a satisfactory component. It is therefore desirable to test the component prior to insertion so that defective components are discarded at an early stage. Because of the number of leads and the complexity of the electronic components, such testing is expensive and time consuming and can introduce an additional operation into the assembly procedure. The manipulator mechanism in accordance with the present invention may be used to make electrical contact to the leads of appropriate electronic components so that the component can be electrically tested immediately prior to assembly. This has the advantage of not requiring an additional assembly stage, since the component can be tested in the same operation for which it is held for subsequent insertion in a circuit board.

Figure 3:
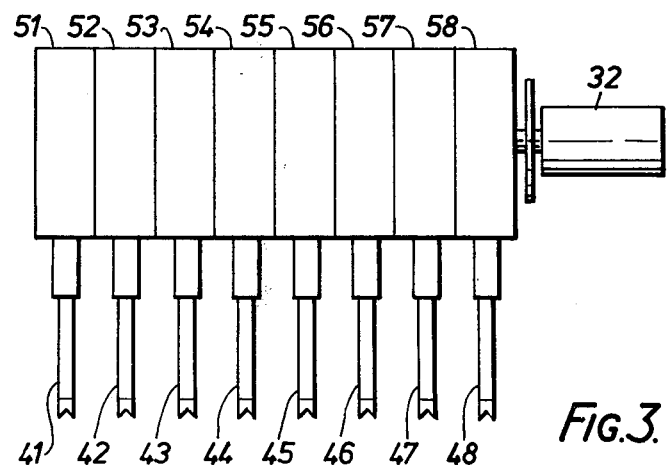
Figure 2:
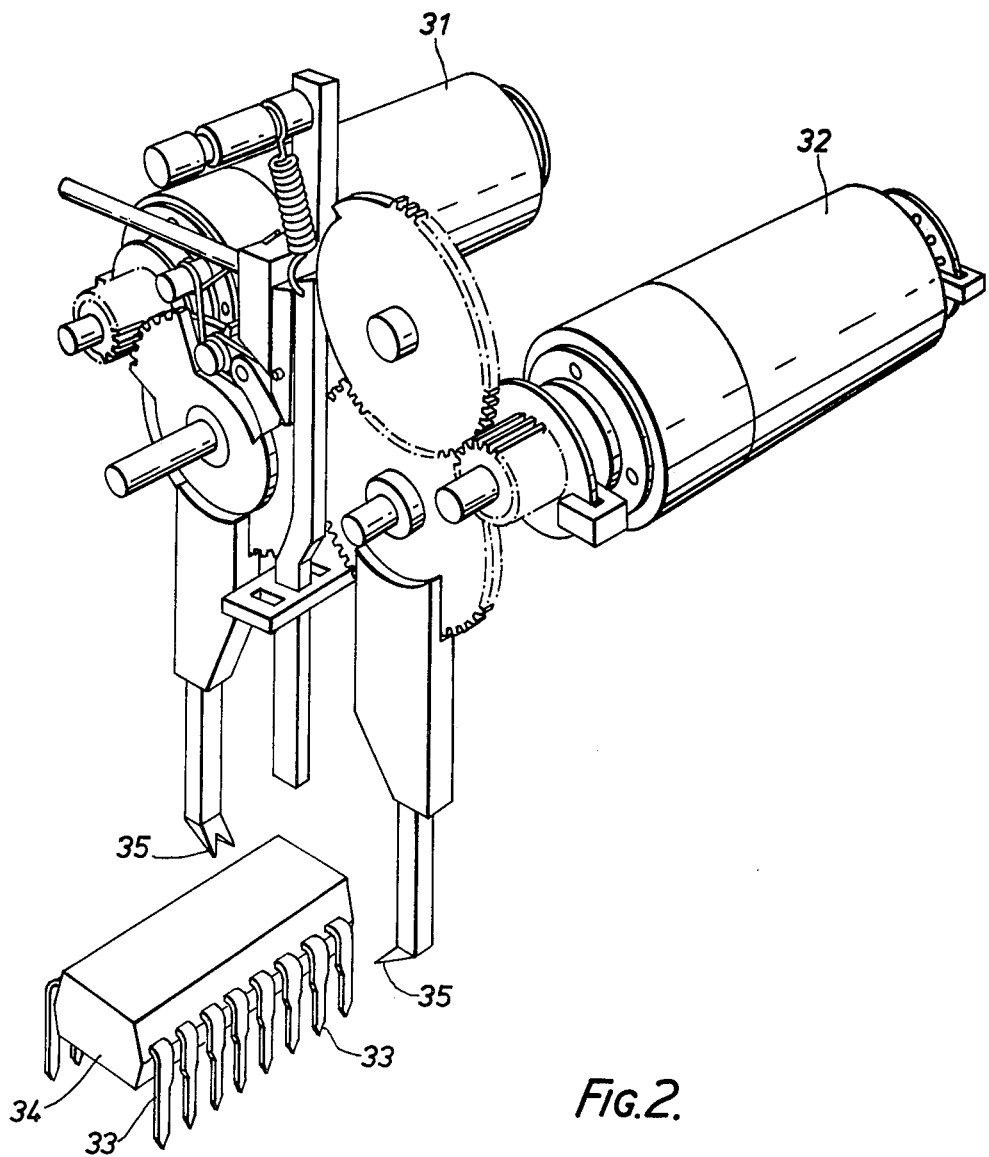

The invention is further described by way of example with reference to the accompanying drawings in which, FIG. 1 shows a section view of a manipulator mechanism in accordance with the present invention, FIG. 2 shows a perspective section view of the same mechanism and a perspective view of a typical electronic component with which it can be used, and FIG. 3 shows in diagrammatic form a side view of the manipulator mechanism.

Referring to FIGS. 1 and 2, the manipulator mechanism contains a pair of fingers 1 and 2. Typically, eight such pairs of fingers would be provided, one behind the other and the arrangement of the pairs relative to each other can best be seen on FIG. 3. Fingers 1 and 2 are rigidly secured to a pair of meshing gear wheels 3 and 4 which are of equal diameter. Gear wheel 3 is mounted so as to be freely rotatable on a shaft 18, and a loose quadrant 5 is located on the hub of the gear wheel 3, so that it can be driven by a pinion 6, which is in turn coupled to an electric motor 31. A pawl 8 is attached to the face of the gear wheel 3 so that it can engage with a notch 21 in the quadrant 5, but in its rest state it is held out of engagement by a spring 9.

An actuating plunger 11 is coupled to an electro-magnetic solenoid (not shown) and is arranged to bear against one end of a pivot lever 10. Movement of the plunger 11 in the direction of the arrow 22 causes pivoting motion of the lever 10, the other end of which bears against the pawl 8, thereby engaging it with the notch 21. Movement of the actuating plunger 11 also causes a push-rod 12 to pivot about a fulcrum defined by a slotted bar 23 until the upper end of the push-rod 12 bears against part of a further gear wheel 13.

The gear wheel 4 is mounted so as to be free to rotate on a shaft 19. A sector of gear teeth is removed from the gear wheel 4, but those teeth which remain are able to mesh with a further pinion 7 which also engages with the gear wheel 13. It will be seen that a large section of the teeth of gear wheel 13 have been removed so that the upper end of the push-rod 12 can bear against a smooth arcuate surface. The gear wheel 13 is also provided with a projecting notch 24.

When the mechanism is at rest, the lever 10 and the push-rod 12 adopt the position shown in FIG. 1, and the spring 9 holds the pawl 8 out of engagement with the notch 21. A further spring 14 bears against a projection on gear wheel 3 so as to exert a clockwise force upon it.

The force is communicated to gear wheel 4 as an anti-clockwise force which causes the edge of the sector from which teeth have been removed to bear against the pinion 7. Thus pinion 7 acts as a stop which defines a datum position for the pair of fingers 1 and 2.

The arrangement shown in FIG. 1 relates to the operation of one pair of fingers 1 and 2. In practice, many such pairs of fingers would be provided. In the example shown in FIG. 3, eight pairs 41 to 48 are used and for each pair of fingers a mechanism 51 to 58 similar to that shown in FIG. 1 is provided. Some parts of the mechanism are, of course, common to all fingers. For example, only two electric motors 31 and 32 are provided and they drive the respective pinions 6 and 7 which are sufficiently long so as to extend over the entire length of the mechanism enabling the pinions to engage with the appropriate quadrant 5 and the gear wheel 4 for each pair 41 to 48 of fingers. A separate push-rod 12 is provided for each pair of fingers and the push-rod 12 is located in an appropriate slot in the bar 23. The rod 12 is slidable vertically in the slot—it is urged in an upwards direction by a tension spring 17, but upwards movement of the rod 12 is limited by the abutment of a peg 25 against the lower side of the slotted bar 23.

The operation of the arrangement is as follows. The initial rest position is as shown in FIG. 1 in which the fingers 1 and 2 are arranged symmetrically about the datum line 37. The plunger 11 is moved in the direction of the arrow 22 by action of the electro-magnetic solenoid, so that the lever 10 pivots to engage the pawl 8 against the notch 21 and the upper end of the push-rod 12 is brought into contact with the arcuate surface of the gear wheel 13. Subsequent rotation of the pinion 6 in a clockwise direction by the electric motor 31 which is coupled to it causes an anti-clockwise motion of the quadrant 5. The gear wheels 3 and 4 follow the motion of the quadrant 5 so that the fingers 1 and 2 move closer together as the pinion 6 rotates. The extent of the movement is determined by a rotatable position indicator consisting of an optical sensor 26 and an apertured disc 27. By conventional means the angular position of the disc 27 can be precisely determined by means of the sensors which detect with great accuracy the location of the apertures in the apertured disc. In practice, the fingers 1 and 2 are brought together until the tips 35 of the fingers engage with the individual electrically conductive leads 33 of the electronic component 34 shown in FIG. 2.

Those pairs of fingers which are not required to contact the component may interfere with neighbouring components which have already been assembled. To avoid this difficulty the remaining fingers are moved outwardly from their initial rest position by a second electric motor 32 which is coupled to the pinion 7. Rotation of the pinion 7 in a clockwise direction causes it to engage with the teeth of the gear wheel 4, which is biassed into contact with it by the action of the spring 14 as previously mentioned. It will be appreciated that those fingers which have already been moved towards each other so as to grip an electronic component will not be affected by the rotation of the pinion 7, since for these fingers the pinion 7 will not be able to engage with the teeth of gear wheel 4.

As the gear wheels 3 and 4 rotate together to move the fingers 1 and 2 further apart, the pinion 7 also rotates the gear wheel 13 in a clockwise direction. As it does so the notch 24 engages on the top end of those push-rods 12 which have been moved by the action of the plunger 11. When an electronic component has been correctly positioned over the circuit board on which it is to be mounted, the push-rods 12 are moved by engagement with the notches 24 so that they push downwards on the electronic component in a linear manner with sufficient force to insert the leads 33 into co-operating holes in the circuit board.

The initial starting position for the fingers is determined by the pinion 7 which is rotated back until its teeth disengage from the teeth of the gear wheel 4. Its rotation position is sensed by a further optical sensor 16 and an apertured disc 15.

It will be apparent that various modifications are possible. For example since all the gear wheels 13 rotate together for all mechanism 51 to 58, a single bar could be used to depress all those push-rods 12 which have been selected by movement of the appropriate plunger 11. Additionally instead of the provision of the quadrants 5 and the pinion 6, the shaft 18 could be driven directly by the electric motor 31 with the pawls 8 being arranged to selectively engage with pins carried by the shaft 18 when inwards movement of the fingers is required.

The form of construction adopted allows adjacent pairs of fingers to be positioned very close together, a pitch of only 0.1 inch being typical.

In practice the fingers 1 and 2 and the gear wheels 3 and 4 are electrically formed of metal to give them strength and rigidity. However the tips of the fingers are arranged so that each can be electrically isolated from all other fingers. This permits an electronic component, such as component 34 to be electrically tested immediately prior to insertion in a circuit board. Electrical test measurements are carried out via flexible electric leads coupled to the movable fingers by a convenient means (not shown). In practice the claw at the tip of each finger is of metal and is mounted on the lower end of each finger. The lower end of each finger is of electrically insulating material to provide the required degree of electrical isolation.

The mechanism shown in the drawings would be mounted on a movable arm, so that an electronic component can be picked up from one location, and transferred to another location and precisely positioned on a circuit board.

I claim:

1. A manipulator mechanism including a plurality of pairs of fingers, both fingers of a given pair being capable of movement towards each other in a single plane relative to each other about a datum line lying in said plane, said single planes for all pairs of fingers being parallel to each other and the datum line of all pairs lying in the same plane which is perpendicular to said single planes, each pair of fingers being movable independently of at least some other pairs of fingers; and wherein said movement is produced by means of a pair of engaging wheels one of which drives the other so that rotation of one wheel in one direction produces an opposite rotation of the other wheel, with at least one finger being moved by the action of each wheel; and means for moving fingers of selected pairs towards each other under action of a common drive means.

2. A mechanism as claimed in claim 1 and wherein the movement of both fingers of a pair is symmetrical about the datum line.

3. A mechanism as claimed in claim 2 and wherein movement in the mutual symmetrical manner is produced by means of a pair of engaging wheels, one of which drives the other so that rotation of one wheel in one direction produces an equal and opposite rotation of the other wheel.

4. A mechanism as claimed in claim 3 and wherein the pair of wheels are meshing gear wheels of equal diameter.

5. A mechanism as claimed in claim 4 and wherein a separate pair of meshing gear wheels are provided for each pair of fingers, with the axes of rotation of the gear wheels lying perpendicular to the plane of movement of the fingers.

6. A mechanism as claimed in claim 1 and wherein first common drive means are provided for moving fingers of selected pairs towards each other and second common drive means are provided for moving fingers of remaining non-selected pairs away from each other.

7. A mechanism as claimed in claim 1 and wherein at least some of said fingers are electrically conductive and are each mounted so as to be electrically isolated from other fingers.

8. A mechanism as claimed in claim 1 and wherein the fingers are shaped to grip a body, and means are provided for extending a force in a linear direction on a body gripped by the fingers.

* * * * *